United States Patent
Tian et al.

(10) Patent No.: US 8,480,848 B2
(45) Date of Patent: Jul. 9, 2013

(54) PLASMA PROCESSING APPARATUS

(75) Inventors: Caizhong Tian, Tokyo (JP); Tetsuya Nishizuka, Tokyo (JP); Toshihisa Nozawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 894 days.

(21) Appl. No.: 12/095,262

(22) PCT Filed: Nov. 15, 2006

(86) PCT No.: PCT/JP2006/322750
§ 371 (c)(1),
(2), (4) Date: May 28, 2008

(87) PCT Pub. No.: WO2007/063708
PCT Pub. Date: Jun. 7, 2007

(65) Prior Publication Data
US 2009/0242130 A1    Oct. 1, 2009

(30) Foreign Application Priority Data
Nov. 29, 2005    (JP) .................................. 2005-344643

(51) Int. Cl.
*C23C 16/00*    (2006.01)
*C23F 1/00*    (2006.01)
*H01L 21/306*    (2006.01)

(52) U.S. Cl.
USPC ............ 156/345.41; 156/345.35; 156/345.36; 118/723 MW; 118/723 R; 118/723 ME; 118/723 MR

(58) Field of Classification Search
USPC ....... 118/723 MW, 723 R, 723 ME, 723 MR; 156/345.41, 345.35, 345.36
See application file for complete search history.

(56) References Cited

U.S. PATENT DOCUMENTS

| | | | | |
|---|---|---|---|---|
| 6,091,045 A | * | 7/2000 | Mabuchi et al. | 219/121.43 |
| 6,528,752 B1 | * | 3/2003 | Ishii et al. | 219/121.43 |
| 6,622,650 B2 | * | 9/2003 | Ishii et al. | 118/723 MW |

(Continued)

FOREIGN PATENT DOCUMENTS

| | | |
|---|---|---|
| JP | 03-191073 A | 8/1991 |
| JP | 05-343334 A | 12/1993 |

(Continued)

OTHER PUBLICATIONS

Japanese Office action for 2005-344613 dated Nov. 9, 2010.

(Continued)

*Primary Examiner* — Rakesh Dhingra
(74) *Attorney, Agent, or Firm* — Pearne & Gordon LLP

(57) ABSTRACT

The present invention relates to a plasma processing apparatus including: a processing chamber whose ceiling portion is opened and the inside thereof can be evacuated to vacuum; a ceiling plate which is made of dielectric material and is airtightly mounted to an opening of the ceiling portion; a planar antenna member which is installed on a top surface of the ceiling plate, for introducing a microwave into the processing chamber; and a coaxial waveguide, which has a central conductor connected to the planar antenna member, for supplying the microwave, wherein a gas passage is formed to pass through the central conductor, the planar antenna member, and the ceiling plate, and an electric field attenuating recess for attenuating an electric field intensity of the center portion of the ceiling plate is installed on a top surface of a center area of the ceiling plate.

8 Claims, 5 Drawing Sheets

U.S. PATENT DOCUMENTS

| | | | |
|---|---|---|---|
| 2004/0026039 A1* | 2/2004 | Goto et al. | 156/345.41 |
| 2004/0168769 A1* | 9/2004 | Matsuoka et al. | 156/345.33 |
| 2005/0172901 A1* | 8/2005 | Ishibashi et al. | 118/723.001 |
| 2007/0113788 A1* | 5/2007 | Nozawa et al. | 118/723 MW |

FOREIGN PATENT DOCUMENTS

| | | |
|---|---|---|
| JP | 06-120155 A | 4/1994 |
| JP | 09-181052 A | 7/1997 |
| JP | 2003-332326 A | 11/2003 |
| JP | 2004-039972 A | 2/2004 |
| JP | 2004-265916 A | 9/2004 |
| JP | 2004-266268 A | 9/2004 |
| JP | 2005-268763 A | 9/2005 |
| WO | WO 03/105544 | * 12/2003 |
| WO | WO 2005/031830 | * 7/2005 |

OTHER PUBLICATIONS

Japanese Office for 2005-344643 dated Oct. 4, 2011.
Japanese Office action for 2005-344643 dated Jan. 10, 2012.

* cited by examiner

<CONVENTIONAL STRUCTURE>

<STRUCTURE OF THE PRESENT INVENTION>

PLASMA PROCESSING APPARATUS

TECHNICAL FIELD

The present invention relates to a plasma processing apparatus used for processing a semiconductor wafer or the like by applying thereon plasma generated by a microwave.

BACKGROUND ART

Along with a recent trend of a high density and a high miniaturization of semiconductor devices, a plasma processing apparatus has been used for performing a film forming process, an etching process, an ashing process and the like in a manufacturing process of the semiconductor devices. Especially, since plasma can be stably generated even in an environment of a high vacuum level in which a pressure is comparatively low, e.g., from about 0.1 mTorr (13.3 mPa) to several tens mTorr (several Pa), a microwave plasma apparatus for generating high-density plasma by using a microwave tends to be used.

Such a plasma processing apparatus is disclosed in Japanese Patent Laid-open Publication Nos. H3-191073, H5-343334, H9-181052, 2003-332326, or the like. Herein, a typical microwave plasma processing apparatus using a microwave will be schematically described with reference to FIG. 8. FIG. 8 is a schematic configuration diagram illustrating a conventional typical microwave plasma processing apparatus.

As illustrated in FIG. 8, a plasma processing apparatus 202 has an evacuable processing chamber 204 and a substrate holder 206 for mounting thereon a semiconductor wafer W in the processing chamber 204. Further, airtightly provided on a ceiling portion facing the substrate holder 206 is a ceiling plate 208, made of, e.g., disk-shaped aluminum nitride, quartz, or the like, for transmitting a microwave. Further, in a side wall of the processing chamber 204, a gas nozzle 209 for introducing a predetermined gas into the processing chamber 204 is installed.

Provided on or above a top surface of the ceiling plate 208 is a disk-shaped planar antenna member 210 having a thickness of several mm. Disposed on or above a top surface of the planar antenna member 210 is a slow wave member 212 made of, e.g., a dielectric material, for shortening a wavelength of the microwave in a radial direction of the planar antenna member 210.

The planar antenna member 210 includes a plurality of microwave radiation holes 214 formed of through holes having, for example, a shape of an elongated groove. The microwave radiation holes 214 are generally arranged in a concentric or spiral pattern. Additionally, a central conductor 218 of a coaxial waveguide 216 is connected to a center portion of the planar antenna member 210, so that a microwave of, e.g., 2.45 GHz, generated by a microwave generator 220 can be guided to the planar antenna member 210 after being converted to a predetermined oscillation mode by a mode converter 222. With this configuration, the microwave is emitted from the microwave radiation holes 214 provided in the planar antenna member 210, and is transmitted through the ceiling plate 208, and is introduced into the processing chamber 204 while propagating along a radial direction of the antenna member 210 in a radial shape. By this microwave, plasma is generated in a processing space S of the processing chamber 204, so that a plasma processing such as an etching, a film formation or the like can be performed on the semiconductor wafer W held on substrate holder 206.

Meanwhile, when the plasma processing is performed, the process needs to be performed uniformly on a wafer surface. However, a gas needed for the plasma process is provided from the gas nozzle 209 installed in the side wall of the processing chamber 204. As a result, at an area adjacent to an outlet of the gas nozzle 209 and at a center area of the wafer W, a time, during which the processing gas is diffused and exposed to plasma, varies. Accordingly, a dissociation degree of the gas varies. Due to such a reason, the surface of the wafer, on which the plasma processing (specifically, an etching rate or a thickness of a film formed) is performed, becomes a non-uniform state within the surface. This phenomenon tends to occur remarkably as a wafer size increases, for example, from 8 to 12 inches.

With regard to this point, for example, Japanese Patent Laid-open Publication No. 2003-332326 discloses installing a gas flow path inside of the rod-shaped central conductor 218, which passes through a center of the coaxial waveguide 216, by making the central conductor 218 cavity state or empty state; and also, installing a gas flow path passing through the ceiling plate 208; and then communicating (connecting) these gas flow paths with each other. In this case, the processing gas is introduced directly into a center portion of the processing space S.

However, in this case, an electric field intensity is increased to a certain degree within the gas flow path formed in the center portion of the ceiling plate 208, so that an abnormal discharge of plasma may occur inside of the gas flow path near the outlet of the processing gas. There is a likelihood that such an abnormal discharge of plasma excessively heats up the center portion of the ceiling plate 208, thereby damaging the ceiling plate 208.

Further, in this case, it can be considered to form a gas flow path, in the ceiling plate 208 itself, extended from its peripheral portion to the center portion. However, in this case as well, the electric field intensity inside of the gas flow path increases, so that the above-mentioned abnormal discharge of plasma is likely to occur.

DISCLOSURE OF THE INVENTION

Inventors of the present invention have focused their research on an electric field distribution in the ceiling plate of the plasma processing apparatus. As a result, by installing a recess having a predetermined size and shape on a top surface of the center portion of the ceiling plate, it has been found that an electric field intensity in the recess can be attenuated and reduced, so that the present invention is derived.

In view of the foregoing, the present invention is conceived to effectively solve the problems. An object of the present invention is to provide a plasma processing apparatus capable of suppressing an abnormal discharge of plasma by attenuating or reducing an electric field intensity in the center portion of the ceiling plate.

In accordance with the present invention, there is provided a plasma processing apparatus including: a processing chamber whose ceiling portion is opened and the inside thereof can be evacuated to vacuum; a substrate holder, installed in the processing chamber, for mounting a substrate to be processed; a ceiling plate which is made of a microwave transmissive dielectric material and is airtightly mounted to an opening of the ceiling portion; a planar antenna member which is installed on a top surface of the ceiling plate, for introducing a microwave into the processing chamber; and a coaxial waveguide, which has a central conductor connected to a center portion of the planar antenna member, for supplying the microwave, wherein a gas passage is formed to pass through the central conductor, the center portion of the planar antenna member, and a center portion of the ceiling plate, and an electric field attenuating recess for attenuating an electric field intensity of the center portion of the ceiling plate is installed on a top surface of a center area of the ceiling plate.

In accordance with the present invention, since the electric field attenuating recess for attenuating the electric field intensity of the center portion of the ceiling plate, in which the gas passage is formed, is installed on the top surface of the center portion of the ceiling plate, an abnormal discharge of plasma within the gas passage can be restrained. In addition, because the abnormal plasma discharge can be restrained, the ceiling plate is not partially heated excessively and damaging of the ceiling plate can also be prevented. Further, because a gas is provided from the center portion of the ceiling plate, the time during which the gas is exposed to plasma in a processing space can be averaged. As a result, a dissociation state of the gas can be uniformized.

For example, the electric field intensity in the center portion of the ceiling plate is attenuated until it becomes substantially zero.

Further, desirably, a plate-shaped slow wave member for shortening a wavelength of the microwave is installed on a top surface of the planar antenna member.

Furthermore, for example, the electric field attenuating recess is formed in a cylinder shape, a diameter D1 of the electric field attenuating recess is an integer multiple of ½ of a wavelength λ in the slow wave member of the microwave, and a depth H1 of the electric field attenuating recess is an odd number multiple of ¼ of the wavelength λ.

Moreover, desirably, a porous member for diffusing a gas into the processing chamber is installed near a gas outlet of the gas passage. In this case, the gas can be diffused into the processing chamber and introduced thereto. Moreover, plasma in the processing chamber can be prevented from being rotationally entered into the gas passage.

Additionally, for example, a front end portion of the central conductor is extended to the top surface of the ceiling plate through the center portion of the planar antenna member, and a sealing member is interposed between the front end portion of the central conductor and the top surface of the ceiling plate.

Also, for example, a frequency of the microwave is about 2.45 GHz and a diameter of the gas passage is at least about 16 mm.

Further, desirably, a supplementary gas introducing unit having a gas introducing nozzle installed through a sidewall of the processing chamber is installed. In this case, by using the supplementary gas introducing unit, the dissociation state of the gas in the processing chamber can be more uniformized.

BEST MODE FOR CARRYING OUT THE INVENTION

Hereinafter, an embodiment of a plasma processing apparatus in accordance with the present invention will be explained in detail in conjunction with the accompanying drawings.

Figure 1:
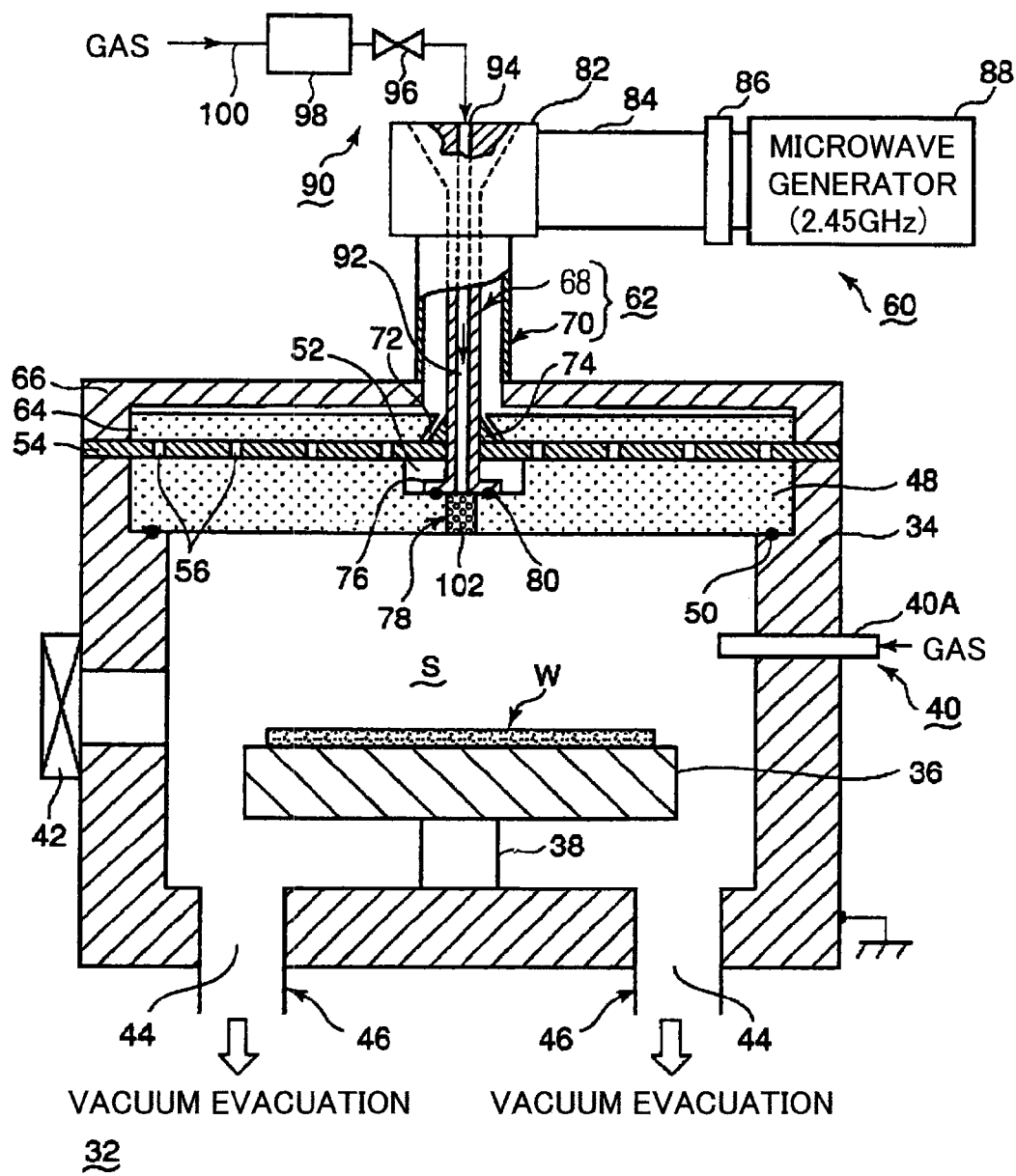
FIG. 1 is a configuration view of a plasma processing apparatus in accordance with an embodiment of the present invention.
Figure 2:
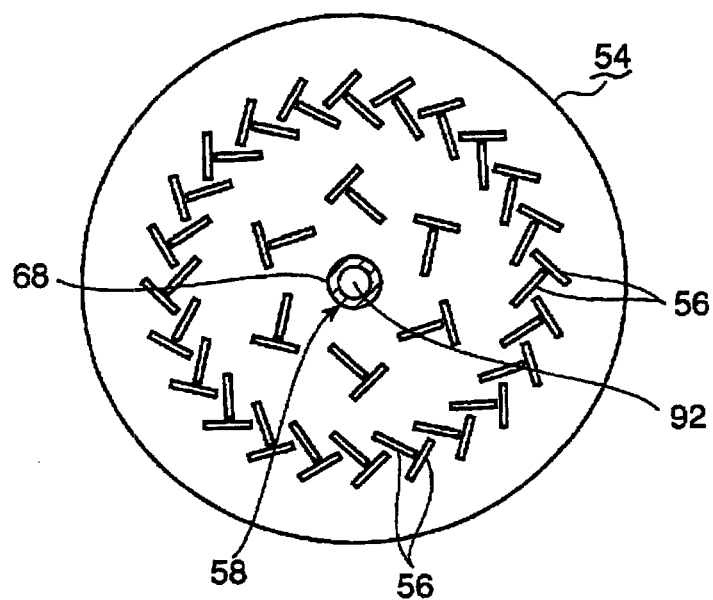
FIG. 2 presents a plan view of a planar antenna member of the plasma processing apparatus illustrated in FIG. 1.
Figure 3:
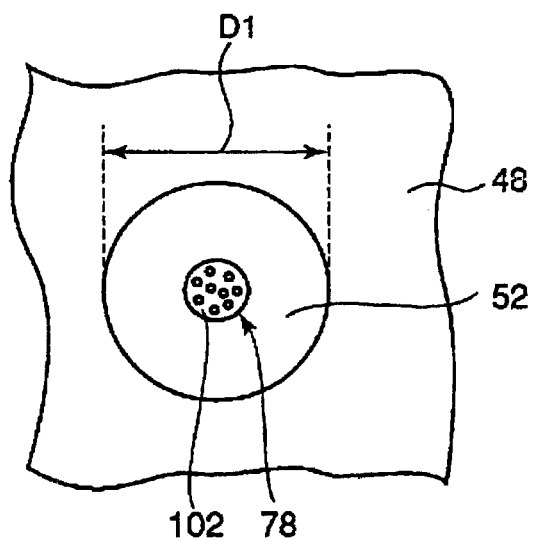
FIG. 3 illustrates a plan view of an electric field attenuating recess of the plasma processing apparatus illustrated in FIG. 1.
Figure 4:
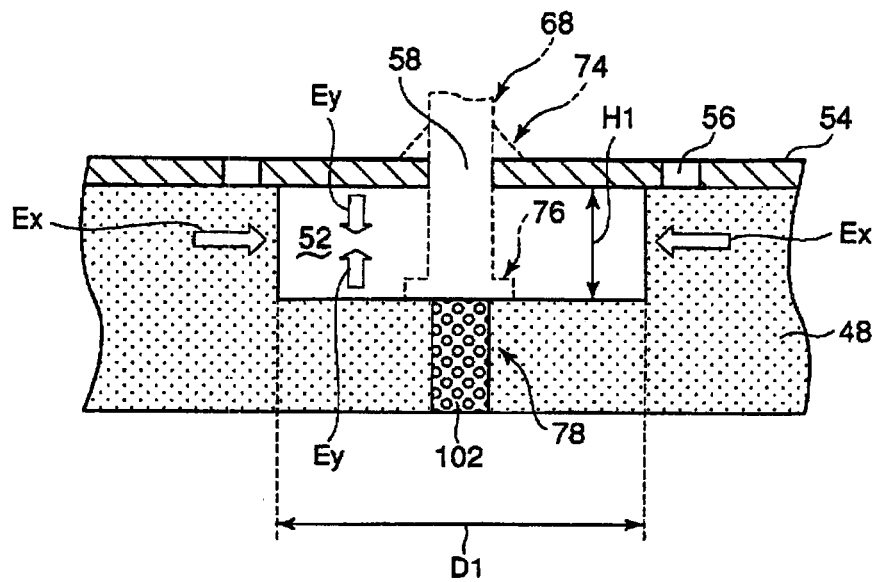
FIG. 4 is a partial enlarged cross-sectional view illustrating the electric field attenuating recess of the plasma processing apparatus shown in FIG. 1.
Figure 5:
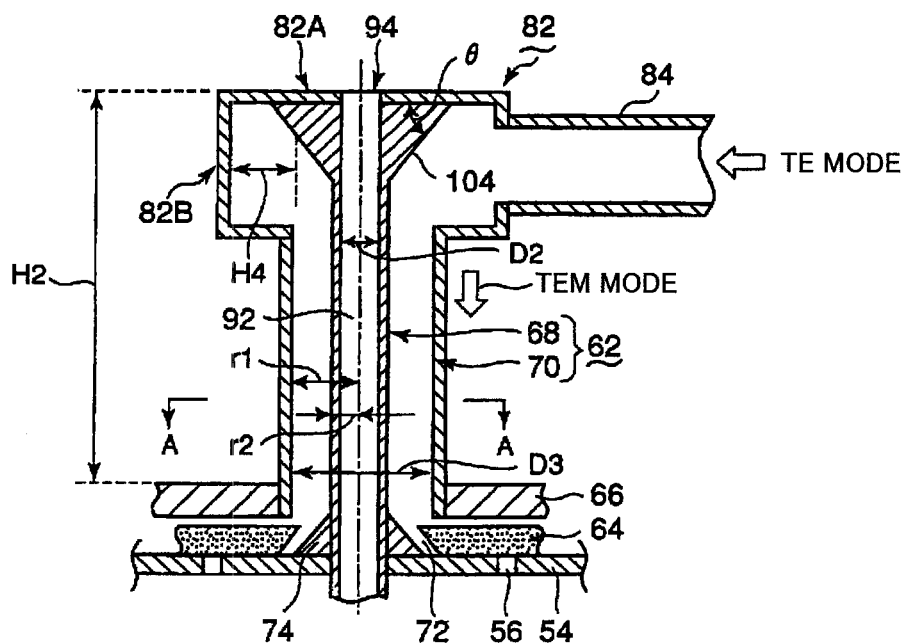
FIG. 5 depicts an enlarged cross-sectional view of a coaxial waveguide of the plasma processing apparatus illustrated in FIG. 1.
Figure 6:
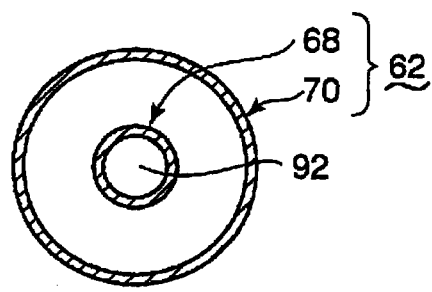
FIG. 6 sets forth a cross-sectional view taken along a line A-A in FIG. 5.

FIG. 1 is a configuration view illustrating a plasma processing apparatus in accordance with an embodiment of the present invention. FIG. 2 is a plan view illustrating a planar antenna member of the plasma processing apparatus illustrated in FIG. 1. FIG. 3 is a plan view illustrating an electric field attenuating recess of the plasma processing apparatus illustrated in FIG. 1. FIG. 4 is a partial enlarged cross-sectional view illustrating the electric field attenuating recess of the plasma processing apparatus shown in FIG. 1. FIG. 5 is an enlarged cross-sectional view illustrating a coaxial waveguide of the plasma processing apparatus in FIG. 1. FIG. 6 is a cross-sectional view taken along a line A-A of FIG. 5.

As shown in FIG. 1, a plasma processing apparatus (plasma etching apparatus) 32 in accordance with the embodiment of the present invention includes a processing chamber 34 formed in a cylindrical shape as a whole. A sidewall and a bottom portion of the processing chamber 34 are made of a conductor such as aluminum or the like, and are grounded. The inside of the processing chamber 34 is configured as an airtightly sealed processing space S, and plasma is generated in this processing space S.

Disposed inside the processing chamber 34 is a substrate holder 36 for mounting a substrate to be processed, e.g., semiconductor wafer W, on a top surface thereof. The substrate holder 36 is of a flat circular-plate shape and is made of, for example, alumite-treated aluminum or the like. The substrate holder 36 is sustained on a supporting column 38 which is made of, for example, insulating materials and stands on the bottom portion of the processing chamber 34.

Installed on the top surface of the substrate holder 36 is an electrostatic chuck or a clamp device (not shown) for holding the semiconductor wafer W. The substrate holder 36 may be connected to a high frequency bias power supply of, e.g., about 13.56 MHz. Further, if necessary, the substrate holder 36 may have therein a heater.

At the side wall of the processing chamber 34, as a supplementary gas introducing unit 40, a gas introducing nozzle 40A, formed of a quartz pipe, for introducing a predetermined gas into the processing chamber 34 is installed. A gas can be supplied from each of the nozzles 40A when necessary, while its flow rate is being controlled. The supplementary gas introducing unit 40 is installed, as needed. Plural kinds of gases may be introduced by plural nozzles.

Moreover, installed at the sidewall of the processing chamber 34 is a gate valve 42 which can be opened/closed, whereby the wafer is loaded into or unloaded from the inside of the processing chamber 34. Further, a gas exhaust port 44 is provided at the bottom portion of the processing chamber 34. Connected to the gas exhaust port 44 is a gas exhaust path 46 on which a vacuum pump (not shown) is provided. With this arrangement, the inside of the processing chamber 34 can be evacuated to a specific pressure level if necessary.

Furthermore, a ceiling portion of the processing chamber 34 is opened (or has an opening). A microwave transmissive ceiling plate 48 is airtightly provided at the opening via a sealing member 50 such as an O ring. The ceiling plate 48 is made of, for example, quartz, a ceramic material, or the like. The thickness of the ceiling plate 48 is set to be, for example, about 20 mm in consideration of pressure resistance.

On the top surface of the center portion (center area) of the ceiling plate 48, an electric field attenuating recess 52, which is engraved in a cylinder-shape and is a technical feature of the present invention, is formed. The detailed structure of the electric field attenuating recess 52 will be described later. Also, a disk-shaped planar antenna member 54 is adjoined to and installed on the top surface of the ceiling plate 48.

In case of a wafer having a size of about 8 inches, the planar antenna member 54 is made of a conductive material having a diameter of, e.g., about 300 to 400 mm and a thickness of, e.g., about 1 to several mm. More specifically, the planar antenna member 54 can be made of, e.g., an aluminum plate or a copper plate whose surface is plated with silver. Further, the planar antenna member 54 is provided with a plurality of microwave radiation holes 56 formed of through holes having, for example, a shape of an elongated groove, as illustrated in FIG. 2. An arrangement pattern of the microwave radiation holes 56 is not particularly limited. For instance, they can be arranged in a concentric, spiral or radial pattern or can be uniformly distributed over the entire surface of the planar antenna member. For example, as illustrated in FIG. 2, a pair is made by arranging two microwave radiation holes 56 in a T-shape with a little space therebetween, and by arranging 6 pairs in the center portion and 24 pairs in the peripheral portion, an arrangement of two concentric circles is realized as a whole.

Formed at the center portion of the planar antenna member 54 is a through hole 58 having a predetermined size. As described later, a gas is provided via the through hole 58.

Referring back to FIG. 1, the planar antenna member 54 is connected with a microwave supplying unit 60. The planar antenna member 54 is configured to introduce the microwave provided by the microwave supplying unit 60 into the processing chamber S. The microwave supplying unit 60 includes a coaxial waveguide 62.

Also, on the top surface of the planar antenna member 54, a slow wave member 64 of a plate shape having a high permittivity property is installed. The slow wave member 64 is made to shorten a wavelength of a microwave propagated. For the slow wave member 64, for example, quartz or aluminum nitride can be used.

A substantially entire surface of a top portion and a sidewall portion of the slow wave member 64 is enclosed by a waveguide box 66 made of a conductive vessel of a hollow cylindrical shape. The planar antenna member 54 is configured as a bottom plate of the waveguide box 66, and is provided to face the substrate holder 36.

All peripheral portions of the waveguide box 66 and the planar antenna member 54 are electrically connected with the processing chamber 34 and are grounded. Further, an outer conductor 70 of the coaxial waveguide 62 is connected to a top surface of the waveguide box 66. The coaxial waveguide 62 is configured of a central conductor 68 and the outer conductor 70 which is in, for example, a cylindrical shape whose cross section is a circle and is installed to wrap around the central conductor 68 in a coaxial shape by having a predetermined space between the central conductor 68 and the outer conductor 70. The central conductor 68 and the outer conductor 70 are made of, for example, conductors such as stainless steel, copper, or the like. To the center of the top portion of the waveguide box 66, the cylinder-shaped outer conductor 70 of the coaxial waveguide 62 is connected, and the central conductor 68 therein is connected to the center portion of the planar antenna member 54 through a hole 72 formed in the center of the slow wave member 64 by means of a welding or the like. By a welding or the like, a connection member 74 is formed.

The central conductor 68 extends downward through the through-hole 58 of the planar antenna member 54 and reaches the inside of the electric field attenuating recess 52 installed in the top surface side of the ceiling plate 48. Further, a diameter of a lower end portion of the central conductor 68 is enlarged to form a connection flange 76. Furthermore, in the center portion of the electric field attenuating recess 52 of the ceiling plate 48, a through-hole 78 (see FIG. 3) passing through to the downward processing space S is formed. To a peripheral portion of the through-hole 78, the connection flange 76 of the central conductor 68 is airtightly connected via a sealing member 80 such as an O ring or the like.

An upper part of the coaxial waveguide 62 is connected to a microwave generator 88 for generating a microwave of, e.g., about 2.45 GHz via a waveguide 84 on which a mode converter 82 and a matching circuit 86 are installed. With this arrangement, the microwave can be transmitted to the planar antenna member 54. The frequency of the microwave is not limited to about 2.45 GHz, but another frequency, e.g., about 8.35 GHz, can be used. Here, an upper end portion of the central conductor 68 is connected to a ceiling partition wall of the mode converter 82.

As for the waveguide 84, a waveguide whose cross section is a circular shape or a rectangular shape can be used. Also, on the top portion of the waveguide box 66, a ceiling cooling jacket (not shown) may be installed. Further, within the waveguide box 66, the slow wave member 64, which is installed on the top surface side of the planar antenna member 54 and has a high permittivity property, shortens the wavelength of the microwave by the wavelength shortening effect. Furthermore, as the slow wave member 64, for example, quartz, aluminum nitride or the like can be used.

In addition, a gas introducing unit 90 is installed. Specifically, the gas introducing unit 90 includes a gas passage 92 which is formed to pass through the central conductor 68 of the coaxial waveguide 62 and the ceiling plate 48. The gas passage 92 in the central conductor 68, as illustrated in FIG. 6, is formed as a hollow passage by shaping the central conductor 68 into a cavity shape or a pipe shape. Further, in the ceiling plate 48, the through-hole 78 formed in the center portion of the ceiling plate constitutes a part of the gas passage 92. Moreover, in accordance with the present embodiment, since the central conductor 68 passes through the slow wave member 64 and the planar antenna member 54, the gas passage 92 passes through the slow wave member 64 and the planar antenna member 54 as well.

Meanwhile, to a gas inlet 94 formed on the upper end portion of the central conductor 68, a gas supply system 100, on which an opening/closing valve 96 or a flow rate controller 98 such as a mass flow controller and the like are installed, is connected. With this configuration, a gas can be supplied to the gas passage 92 while its flow rate is being controlled if necessary. Also, in the through-hole 78 of the ceiling plate 48 near the gas outlet of the gas passage 92, a porous member 102 is installed to diffuse the gas exhausted therefrom. As the porous member 102, for example, quartz porous material or alumina porous material can be used. Particularly, when the ceiling plate 48 is made of a quartz plate, by using the quartz porous material whose thermal expansion rate is almost equal to that of the quartz plate, the attachment property can be improved.

Hereinafter, a size of the electric field attenuating recess 52 installed in the ceiling 48 will be described. The electric field attenuating recess 52 serves to attenuate the electric field intensity in the center portion of the ceiling plate 48, and, depending on a condition, it serves to attenuate the electric field intensity until it becomes about zero. In order to do so, as illustrated in the following Equations 1 and 2, it is desirable to set a diameter D1 of the electric field attenuating recess 52 to an integer multiple of ½ of a wavelength λ of the microwave within the slow wave member 64 and a depth H1 thereof to an odd number multiple of ¼ of the wavelength λ (see FIGS. 3 and 4).

$$D1 = \lambda/2 \times n \qquad \text{Equation 1}$$

$$H1 = \lambda/4 \times (2n-1) \qquad \text{Equation 2}$$

(Here, n is a Positive Integer)

As illustrated in the FIG. 4, into the electric field attenuating recess 52, the microwaves including a reflected wave are transmitted in a circumferential direction and a vertical direction. Here, in regard to the microwaves Ex transmitted in the circumferential direction, the microwaves Ex having directions opposite to each other are cancelled by satisfying the above Equation 1. Also, in regard to the microwaves Ey transmitted in the vertical direction, since one wave is configured of a reflected wave, the microwaves Ey having directions opposite to each other are cancelled by satisfying the above Equation 2. As a result, the electric field intensity at the corresponding portion, i.e., at the center portion of the ceiling plate 48 can be attenuated, and, for example, can be attenuated until it becomes about zero.

Subsequently, a structure of the coaxial waveguide 62 will be more specifically explained with reference to FIGS. 5 and 6.

In accordance with the present embodiment, in the mode converter 82, an oscillation mode of a microwave generated from the microwave generator 88 is converted from a TE mode to a TEM mode, and a moving direction of the microwave is also curved by 90 degree. An external partition wall of the mode converter 82 is formed as a rectangular shaped box body. Further, a base end, which is the upper end portion of the central conductor 68 of the coaxial waveguide 62, is formed of a cone-shaped connection member 104 whose upper diameter is large, and is connected to the partition wall 82A which is the ceiling plate of the mode converter 82. An inclined angle θ of the conic side of the cone-shaped connection member 104 is set to about 45 degree in order to make the microwave, which progresses from the waveguide 84, face downward by curving its progressing direction by 90 degree.

In comparison with the conventional plasma processing apparatus, diameters of the central conductor 68 and the outer conductor 70 of the coaxial waveguide 62 are set to be larger within the range capable of maintaining basic performances related to the microwave propagation. In addition, an inner diameter D2 of the gas passage 92, formed by making the central conductor 68 an empty (cavity) state inside, is set to above a first determined value. Here, the first determined value is about 16 mm, i.e., a general thickness of the central conductor of the conventional microwave generating apparatus. That is, the inner diameter D2 is set to a value larger than about 16 mm.

Further, each thickness of the central conductor 68 and the outer conductor 70 is set to at least about 2 mm. If its thickness is thinner than that, it causes heating by the microwave.

Here, only if the diameters of the central conductor 68 and the outer conductor 70 are set to be large simply, there is a likelihood that the microwave has plural oscillation modes, a reflectivity of the microwave is deteriorated, or the like. Thus, it is necessary to satisfy design criteria as explained below.

In first criteria, a ratio (r1/r2) of a radius r1 of the inner diameter of the outer conductor 70 to a radius r2 of the outer diameter of the central conductor 68 is maintained as a second predetermined value, and the inner diameter D3 (=2×r1) of the outer conductor 70 is set to below a third predetermined value.

In this case, a characteristic impedance $Z_o$, which is obtained based on the following Equation 3 and the above ratio (r1/r2), is required to fall within the range of, for example, about 40~60Ω. Specifically, the second predetermined value satisfying such a characteristic impedance value is a fixed value within the range of $e^{2/3}$~e (e=2.718 . . . ).

$$Z_o = h/2\pi \cdot \ln(r1/r2) \qquad \text{Equation 3}$$

h: wave impedance (ratio of electric field to magnetic field)
ln: Natural Logarithm
(In Equation 3, in case of $40 \leq Z_o \leq 60$, the range of the ratio r1/r2 is determined.)

Additionally, a method of obtaining a characteristic impedance on a coaxial line and a propagation of a microwave limited to the TEM mode are described in detail in 「Coaxial Line」 (pages 67-70) of a publication 「Microwave Engineering」 (Morikita Electrical Engineering Series 3, Microwave Optics—Foundation and Principles—Writer: Nakajima Masamitsu, Publisher: Morikita Publication, published on Dec. 18, 1998). Therefore, its explanation is omitted here.

Further, the third predetermined value is a 「0.59–0.1」 (=0.49) wavelength of an atmospheric wavelength $\lambda_o$ of the transmitted microwave by considering an experimental safety factor. Here, as shown in the following Equation 4, the inner diameter D3 is set to below 0.49×$\lambda_o$.

$$D3 \leq \lambda_o(0.59-0.1) \qquad \text{Equation 4}$$

By satisfying this condition, the oscillation mode of the microwave propagated within the coaxial waveguide 62 after a mode conversion can become only the TEM mode in which other oscillation modes are not present.

The conditional Equation shown in the Equation 4 is obtained as follows. That is, besides the TEM mode, the easiest mode to transmit a microwave through a circular waveguide (not the coaxial waveguide) is a TEM mode from the higher transmission coefficient, and in this case, a cutoff frequency is shown by the following Equation.

$$Fc = 1.841/2\pi r \sqrt{(\mu \in)}$$

Here, the fc, r, μ, ∈ are the cutoff frequency, a radius of the circular waveguide, an atmospheric permeability, an atmospheric permittivity, respectively.

If this Equation is converted, it becomes r=0.295$\lambda_o$ ($\lambda_o$: an atmospheric wavelength of a microwave), and the diameter of the circular waveguide becomes 2r=0.59$\lambda_o$.

Here, if a microwave having a wavelength longer than $\lambda_o$ is used, only the TEM mode is transmitted. Also, if the circular waveguide is considered as a coaxial waveguide, only the TEM mode is transmitted under condition of $2r\square 2r1=D3\leqq 0.59\lambda_o$. Further, if an experimental safety factor is considered, it becomes '$D3\leqq(0.59-0.1)\lambda_o$' so that the Equation 4 is derived.

As a result, the inner diameter D3: (2×r1) of the outer conductor 70 can be maximum about 60 mm, and also, the outer diameter (2×r2) of the central conductor 68 can be about 30 mm. If the thickness of the central conductor 68 becomes about 2 mm, the inner diameter D2 can be about 26 mm.

Furthermore, as shown in the following Equation 5 as second criteria, it is desirable to set the total length H2 including the mode converter 82 and the coaxial waveguide 62 to an odd number multiple of ¼ wavelength of the atmospheric wavelength $\lambda_o$ of the microwave.

$$H2=\tfrac{1}{4}+\lambda_o\times(2n-1) \qquad \text{Equation 5}$$

n: positive integer

The height H2 is, specifically, a distance between the partition wall 82A of the ceiling of the mode converter 82 and the ceiling plate of the waveguide box 66. By satisfying the second criteria, the progressive wave which progresses through the coaxial waveguide 62 and the reflected wave from the planar antenna member 54 can be cancelled efficiently.

Moreover, as shown in below Equation 6 as third criteria, it is desirable to set a distance H4 between a short-circuit plate 82B, which is in an end surface (left end surface of FIG. 5) located in an inner side of the progressive direction of the microwave entering the mode converter 82, and a middle point of a conic surface of the corresponding side of the connection member 104 to a length of an integer multiple of ½ wavelength of the atmospheric wavelength $\lambda_o$ of the microwave.

$$H4=\tfrac{1}{2}\times\lambda_o\times n \qquad \text{Equation 6}$$

n positive integer

Here, the middle point of the cone-shaped inclined surface of the connection member 104 is located on a line extended in the vertical direction of the cylinder-shaped outer conductor 70 of the coaxial waveguide 62.

By satisfying this third criteria, the progressive wave transmitted from the inside of the waveguide 84 and the reflected wave reflected from the short-circuit plate 82B of the mode converter 82 are synchronized to be effectively combined, and the combined wave can progress to the downward coaxial waveguide 62 (by changing its progressive direction by 90 degree).

As described above, by satisfying the first criteria, the inner diameter of the gas passage 92 formed in the central conductor can be enlarged while maintaining basic performances regarding the microwave. Further, by satisfying the second and third criteria, the above-mentioned operation and effect can be more improved.

Hereinafter, a processing method (etching method) performed by using the plasma processing apparatus 32 configured as mentioned above will be explained.

First, a semiconductor wafer W is accommodated into the processing chamber 34 by a transferring arm (not shown) after passing through the gate valve 42. By moving a lifter pin (not shown) up and down, the semiconductor wafer W is mounted on the mounting surface, which is the top surface of the substrate holder 36.

Further, through the gas supplying nozzle 40A of the supplementary gas introducing unit 40 and the gas passage 92 of the gas introducing unit 90, a gas depending on a processing aspect, for example, an etching gas for an etching process (a film forming gas for a film forming process) is supplied into the processing chamber 34 while its flow rate is being controlled. In the gas introducing unit 90, the gas to be supplied flows through the gas supply system 100 and enters into the gas passage 92 from the gas inlet 94 installed on the upper end portion of the central conductor 68 of the coaxial waveguide 62. After flowing through the gas passage 92, the gas is introduced into the processing space S from the gas outlet of the lower end portion of the through-hole 78 installed in the ceiling plate 48. Then, a predetermined processing pressure inside of the processing chamber 34 is maintained within the range of, for example, about 0.01~several Pa.

At the same time, the microwave of the TE mode generated by the microwave generator 88 of the microwave supplying unit 60 is transmitted to the mode converter 82 via the waveguide 84. In the mode converter 82, the oscillation mode is converted to the TEM mode, and the microwave is provided to the planar antenna member 54 via the coaxial waveguide 62. From the planar antenna member 54 to the processing space S, the microwave whose wavelength is shortened by the slow wave member 64 is introduced. As a result, plasma is generated in the processing space S so that a predetermined etching process is performed.

Here, the microwave of, for example, about 2.45 GHz generated from the microwave generator 88 is transmitted through the coaxial waveguide 62 and then transmitted to the planar antenna member 54 in the waveguide box 66 as described above. While the microwave is propagated from the center portion of the disk-shaped planar antenna member 54 to a peripheral portion in a radial shape, the microwave is transmitted through the ceiling plate 48 from the plurality of microwave radiation holes 56 formed in the planar antenna member 54 and introduced into the processing space S directly under the planar antenna member 54. By this microwave, an argon gas or an etching gas is excited and converted to plasma and diffused in a downward direction, and then an active species is generated by activating the processing gas. Then, the film on the surface of the wafer W is etched by the active species.

Here, since the gas flows in the through-hole 78, which constitutes a part of the gas passage 92, of the ceiling plate 48, there may be a likelihood that an abnormal plasma discharge occurs due to the electric field by the microwave. However, in accordance with the present embodiment, the electric field attenuating recess 52 is installed in the top surface side of the center portion (center area) of the ceiling plate 48, so that the recess attenuates an electric field intensity at the corresponding part (for example, attenuates the electric field intensity to substantially zero), thereby effectively preventing the abnormal plasma discharge.

Specifically, as described above and illustrated in the Equations 1 and 2, the diameter D1 of the electric field attenuating recess 52 is set to an integer multiple of ½ of the wavelength $\lambda$ of the microwave within the slow wave member, and its depth H1 is set to an odd number multiple of ¼ of the wavelength $\lambda$ (see FIGS. 3 and 4). If it is assumed that the frequency of the microwave is about 2.45 GHz and the ceiling plate 48 and the slow wave member 64 are made of quartz whose relative permittivity is about 3.8, then it becomes $\lambda=62$ mm. Accordingly, it can be set as, for example, D1=31 mm, H1=15.1 mm.

As illustrated in FIG. 4, into the electric field attenuating recess 52, the microwaves including the reflected wave are transmitted in a circumferential direction and a vertical direction. Here, in regard to the microwaves Ex transmitted in the circumferential direction, the microwaves Ex having directions opposite to each other are cancelled by satisfying the Equation 1. Also, in regard to the microwaves Ey transmitted in the vertical direction, the microwaves Ey having directions opposite to each other are cancelled by satisfying the Equation 2 since one of them is a reflected wave. As a result, an electric field intensity at the corresponding portion, i.e., at the center portion of the ceiling plate 48, can be attenuated until it becomes, for example, substantially zero.

If an electric field intensity inside of the through-hole 78 of the ceiling plate 48 or near the lower end portion of the central conductor 68 becomes substantially zero, generation of the abnormal plasma discharge at the corresponding portion can be prevented. Thus, the ceiling plate 48 is not heated locally, so that damaging of the ceiling plate 48 can also be prevented.

Further, since the porous member 102 is installed inside of the through-hole 78 of the ceiling plate 48, by a function of the porous member 102, a gas to be introduced can be introduced into the processing space S in a diffused state. In addition, the plasma discharge generated in the processing space S is suppressed by the porous member 102, so that the plasma discharge rotationally entering the through-hole 78 can be prevented. As a result, plasma damaging on the sealing member 80, which seals the lower end portion of the central conductor 68, can be prevented.

Further, since a necessary gas is provided by the gas introducing unit 90 from the center portion of the ceiling plate 48, the corresponding gas is uniformly diffused to the peripheral portion inside of the processing space S. Therefore, in comparison with the conventional apparatus, a uniformity of the dissociation degree of the gas in the processing space S can be improved.

Also, if the same kind of gases are provided from the supplementary gas introducing unit 40 installed in the side wall of the processing chamber 34 as well as the gas introducing unit 90, the gas diffusions from the center portion and the peripheral portion can be combined. As a result, the gases are uniformly diffused throughout the processing space S, so that a uniformity of the dissociation degree of the gases in the processing space S can be improved.

In addition, since the plasma electric field intensity is attenuated in the processing space S directly under the center portion of the ceiling plate 48, the plasma discharge is hardly generated at the corresponding part. However, since a dissociation gas is provided from the peripheral portion sufficiently, the plasma processing itself has no problem.

Hereinafter, with respect to a distribution of an electric field intensity of the microwave in the ceiling plate 48, an actual measurement has been performed and an evaluation has been made. The result of the evaluation is explained below.

Figure 7A:
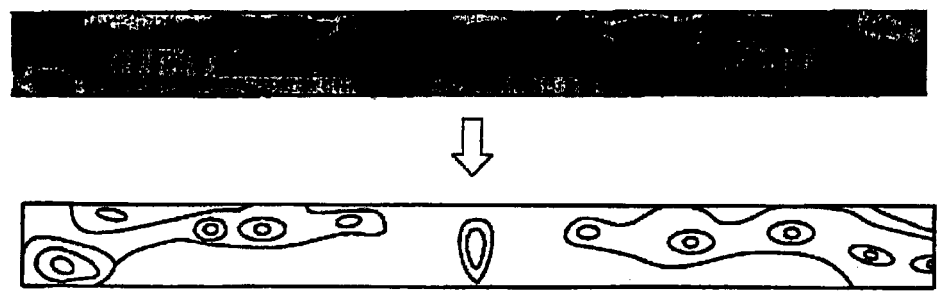
FIG. 7A is a photograph showing a distribution state of an electric field of a microwave with respect to a conventional ceiling plate.
Figure 7B:
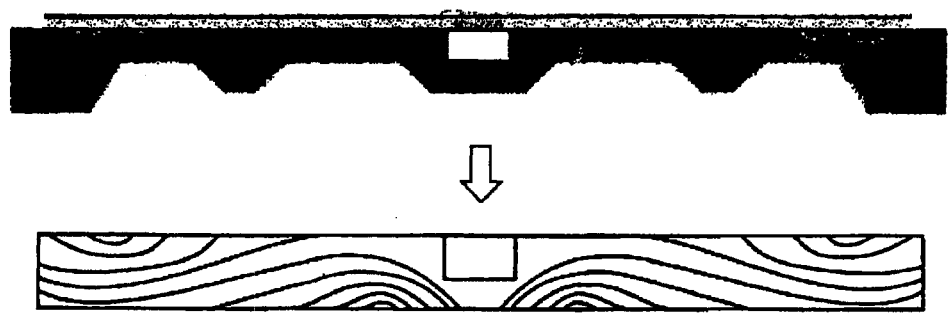
FIG. 7B provides a photograph showing a distribution state of an electric field of a microwave with regard to a ceiling plate in accordance with an embodiment of the present invention.
Figure 8:
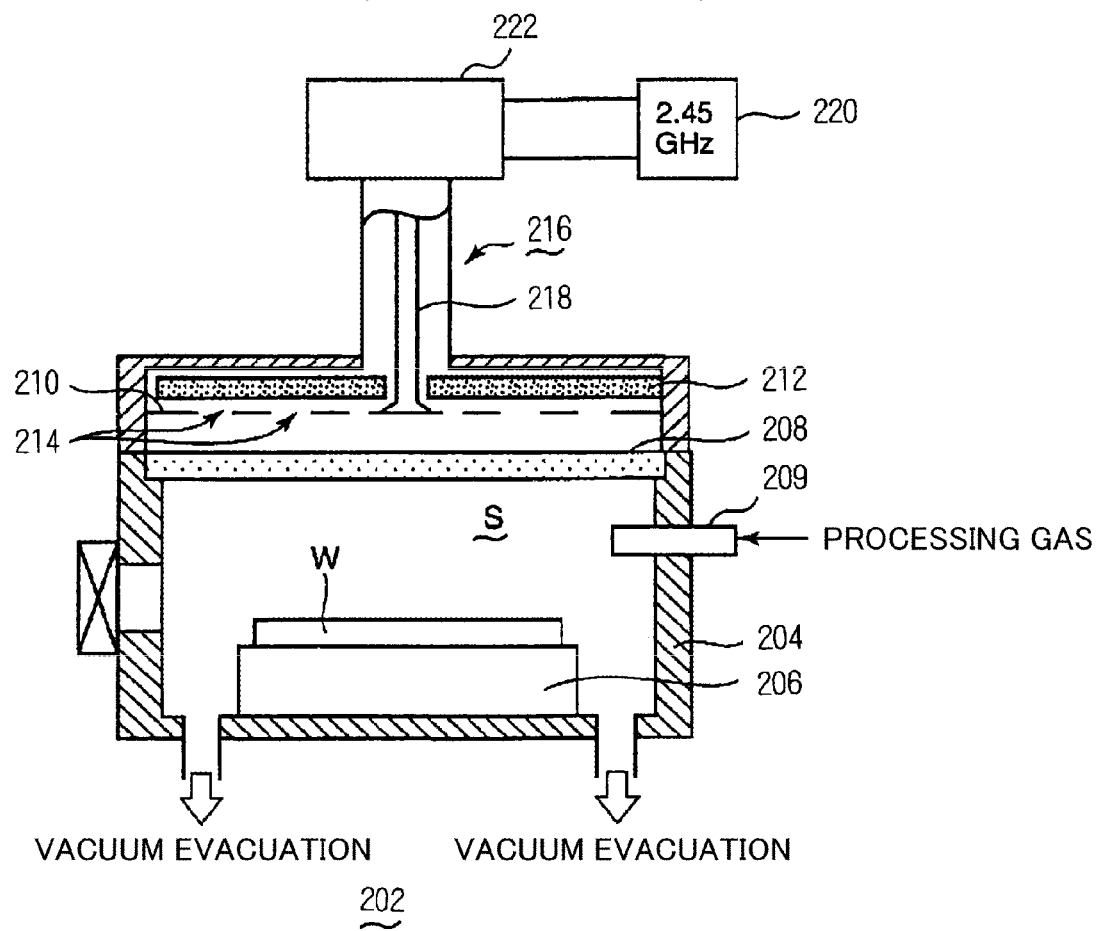
FIG. 8 describes a schematic configuration view of a conventional general plasma processing apparatus.

FIG. 7A is a photograph illustrating a distribution of the electric field intensity of the microwave with regard to the conventional ceiling plate. FIG. 7B is a photograph showing a distribution of the electric field intensity of the microwave in accordance with the present embodiment. In order to facilitate the understanding of each case, schematic diagrams are shown together.

As illustrated in FIG. 7A, in case of the conventional ceiling plate, the electric field intensity of plasma is shown to be higher in the center portion of the ceiling plate. On the contrary, as shown in FIG. 7B, in accordance with the present embodiment, it can be verified that the electric field intensity of plasma in the center portion of the ceiling plate is substantially zero.

In addition, although an example of a plasma etching apparatus has been described as a plasma processing apparatus, the present invention is not limited thereto. The present invention can be applied to a plasma CVD apparatus, a plasma asking apparatus, an oxidation apparatus, a nitridation apparatus, and the like. Further, as a matter of course, a film thickness measuring device can be installed if necessary.

Moreover, in the above-mentioned embodiment, an example of a semiconductor wafer has been explained as a substrate to be processed, but the present invention is not limited thereto. The present invention can be applied to a LCD substrate, a glass substrate, a ceramic substrate, or the like.

Particularly, with respect to the recent LCD substrate of a large size, the microwave can be provided to plural locations of the planar antenna member. With this configuration, more uniformed plasma can be discharged into the large area of the processing space. In this case as well, the electric field attenuating recess of the present invention can be installed in the plural locations to which the microwaves are supplied.

What is claimed is:

1. A plasma processing apparatus comprising:
a processing chamber whose ceiling portion is opened and the inside thereof can be evacuated to vacuum;
a substrate holder, installed in the processing chamber, for mounting a substrate to be processed;
a ceiling plate which is made of a microwave transmissive dielectric material and is airtightly mounted to an opening of the ceiling portion;
a planar antenna member, which is installed on a top surface of the ceiling plate, for introducing a microwave into the processing chamber; and
a coaxial waveguide, which has a central conductor connected to a center portion of the planar antenna member, for supplying the microwave,
wherein an electric field attenuating recess is formed on a top surface of a center area of the ceiling plate, and
a gas passage is formed in the central conductor to pass through the planar antenna member,
wherein a diameter of the electric field attenuating recess is determined to cancel horizontal microwaves transmitted into the electric field attenuating recess in a horizontal direction by canceling the horizontal microwaves having directions opposite to each other, and
a depth of the electric field attenuating recess is determined to cancel vertical microwaves transmitted into the electric field attenuating recess in a vertical direction by canceling the vertical microwaves having directions opposite to each other, thereby attenuating an electric field intensity at a center portion of the ceiling plate until the electric field intensity at the center portion of the ceiling plate becomes substantially zero.

2. The plasma processing apparatus of claim 1, wherein a plate-shaped slow wave member for shortening a wavelength of the microwave is installed on a top surface of the planar antenna member.

3. The plasma processing apparatus of claim 2, wherein the electric field attenuating recess is formed in a cylinder shape,
a diameter D1 of the electric field attenuating recess is an integer multiple of ½ of a wavelength λ in the slow wave member of the microwave, and a depth H1 of the electric field attenuating recess is an odd number multiple of ¼ of the wavelength λ.

4. The plasma processing apparatus of claim 1, wherein a porous member for diffusing a gas into the processing chamber is installed near a gas outlet of the gas passage.

5. The plasma processing apparatus of claim 1, wherein a front end portion of the central conductor is extended to the top surface of the ceiling plate through the center portion of the planar antenna member, and
a sealing member is interposed between the front end portion of the central conductor and the top surface of the ceiling plate.

6. The plasma processing apparatus of claim 1, wherein a frequency of the microwave is about 2.45 GHz and a diameter of the gas passage is at least about 16 mm.

7. The plasma processing apparatus of claim 1, wherein a supplementary gas introducing unit having a gas introducing nozzle installed through a sidewall of the processing chamber is installed.

8. A plasma processing apparatus comprising:

a processing chamber whose ceiling portion is opened and the inside thereof can be evacuated to vacuum;

a substrate holder, installed in the processing chamber, for mounting a substrate to be processed;

a ceiling plate which is made of a microwave transmissive dielectric material and is airtightly mounted to an opening of the ceiling portion;

a planar antenna member, which is installed on a top surface of the ceiling plate, for introducing a microwave into the processing chamber; and a coaxial waveguide, which has a central conductor connected to the planar antenna member, for supplying the microwave, wherein an electric field attenuating recess is formed on a top surface of the ceiling plate, and a gas passage is formed in the central conductor to pass through the planar antenna member, wherein a diameter of the electric field attenuating recess is determined to cancel horizontal microwaves transmitted into the electric field attenuating recess in a horizontal direction by canceling the horizontal microwaves having directions opposite to each other, and a depth of the electric field attenuating recess is determined to cancel vertical microwaves transmitted into the electric field attenuating recess in a vertical direction by canceling the vertical microwaves having directions opposite to each other, thereby attenuating an electric field intensity at a portion of the ceiling plate corresponding to the installation position of the electric field attenuating recess until the electric field intensity at the portion of the ceiling plate becomes substantially zero.

* * * * *

UNITED STATES PATENT AND TRADEMARK OFFICE
CERTIFICATE OF CORRECTION

PATENT NO. : 8,480,848 B2
APPLICATION NO. : 12/095262
DATED : July 9, 2013
INVENTOR(S) : Caizhong Tian et al.

Page 1 of 1

It is certified that error appears in the above-identified patent and that said Letters Patent is hereby corrected as shown below:

In the specification, column 11, line 65, please delete "asking" and add -- ashing --

Signed and Sealed this
Seventeenth Day of September, 2013

Teresa Stanek Rea
*Deputy Director of the United States Patent and Trademark Office*